United States Patent [19]

Cini et al.

[11] Patent Number: 4,736,121

[45] Date of Patent: Apr. 5, 1988

[54] CHARGE PUMP CIRCUIT FOR DRIVING N-CHANNEL MOS TRANSISTORS

[75] Inventors: Carlo Cini, Cornaredo; Claudio Diazzi, Milan; Domenico Rossi, Cilavegna, all of Italy

[73] Assignee: Sos Microelettronica S.p.A., Catania, Italy

[21] Appl. No.: 897,561

[22] Filed: Aug. 18, 1986

[30] Foreign Application Priority Data

Sep. 10, 1985 [IT] Italy .................. 22105 A/85
Mar. 20, 1986 [IT] Italy .................. 19817 A/86

[51] Int. Cl.⁴ ............... H03K 3/01; H03K 3/353; H03K 17/56
[52] U.S. Cl. ............... 307/296 R; 307/304; 307/246; 307/270
[58] Field of Search ............ 307/296 R, 304, 571, 307/575, 577, 584, 482, 246, 270

[56] References Cited

U.S. PATENT DOCUMENTS 4,591,738 5/1986 Bialas, Jr. et al. ............ 307/296 R
4,633,106 12/1986 Backes et al. .................... 307/482

*Primary Examiner*—Stanley D. Miller
*Assistant Examiner*—Trong Quang Phan
*Attorney, Agent, or Firm*—Guido Modiano; Albert Josif

[57] ABSTRACT

This charge pump circuit comprises a capacitor connected with a first terminal thereof to a reference voltage point through a first switch element and with a second terminal thereof to a switching section. The switching section, which is arranged between a positive supply voltage line and the ground, is controlled so as to alternately and selectively connect the second terminal of the capacitor to the positive supply and to ground. The first terminal of the capacitor is further connected to the gate of the MOS transistor to be driven. During operation the switch section is controlled so as to alternately charge the capacitor and allow transfer of the charge of the capacitor to the MOS transistor gate, thereby achieving a fast charging of the MOS transistor and a low circuit dissipation in the DC mode.

5 Claims, 1 Drawing Sheet

CHARGE PUMP CIRCUIT FOR DRIVING N-CHANNEL MOS TRANSISTORS

BACKGROUND OF THE INVENTION

The present invention relates to a charge pump circuit for driving N-channel MOS transistors.

As is known, for driving a load in the motor-car or in general in the industrial field, it is necessary to have driving components which may be power elements or not and should operate in an efficient manner. Nowadays, as driving elements, N-channel MOS transistors are preferred, as they require a lower integration area than analogous P-channel devices. As is also known, these N-channel MOS transistors are designed so as to have their drain connected to the positive supply and their source connected to the load, while their gate should be maintained at a higher voltage than the supply one, so as to assure an efficient and low-dissipation operation of the MOS transistor.

Furthermore for the DC mode, a fast charging of the gate of the MOS transistor is required, so as to assure fast responses of the system (i.e. fast turn-on of the MOS transistor). To this aim, charge pumps are already known which are ground referred to obtain a fast charging of the capacitance of the MOS transistor gate. However, these charge pumps have shown to be inadequte to simultaneous satisfying both requirements.

SUMMARY OF THE INVENTION

Accordingly, the aim of the present invention consists in providing a charge pump circuit capable of solving the disadvantages shown by the prior art.

A particular object of the present invention is to provide a charge pump circuit capable of adequately supplying a load in the DC mode and having a low dissipation during operation.

Another object of the present invention is to provide a charge pump circuit allowing a fast charging of the gate capacitance of the MOS transistor and thus a fast activation time of the circuit.

A further object of the present invention is to provide a charge pump circuit comprising conceptually simple elements, which can be integrated in a single structure according to known technologies, so as to have low manufacturing costs.

The above aim and objects as well others which will be better appreciated hereinafter are achieved by a charge pump circuit for driving N-channel MOS transistors, according to the invention, for connection to a N-channel MOS transistor having a drain electrode connected to a supply voltage line, a source electrode connected to a load and a gate electrode, characterized in that it comprises a capacitor connected with a first terminal thereof to a reference voltage line through a first switch element and with a second terminal thereof to a switching section arranged between said supply voltage line and a ground line and being controlled so as to alternately and selectively connecting said second terminal of said capacitor to said supply voltage line and said ground line, said first terminal of said capacitor being further connected to said gate electrode of said N-channel MOS transistor.

BRIEF DESCRIPTION OF THE DRAWINGS

Further features and advantages will become better apparent from the description of a preferred, but not exclusive, embodiment of the invention, given by way of non-limitative example in the accompanying drawings, where.

DESCRIPTION OF THE PREFERRED EMBODIMENT

Figure 1:
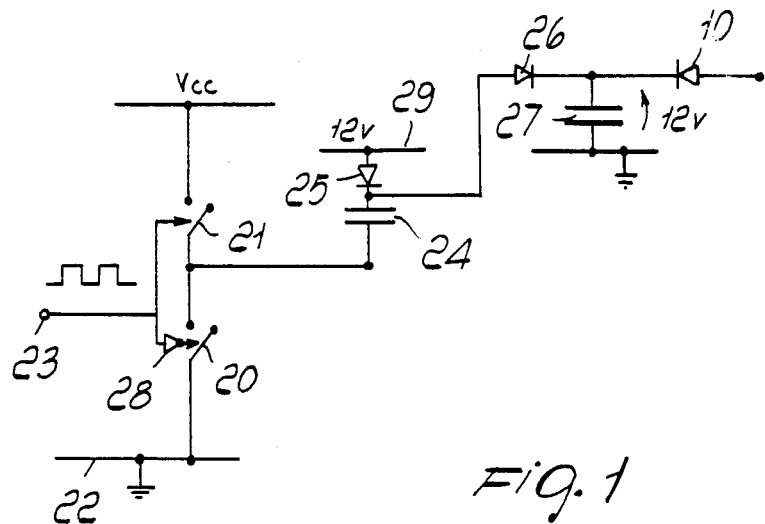
FIG. 1 shows the equivalent electric diagram of the charge pump circuit according to the invention.

With reference to FIG. 1, the equivalent capacitance of the MOS transistor gate is indicated at 27, such capacitance being the element for which a fast charging is desired and which then should be held at a higher voltage than the supply one, so as to shorten the turn-on time of the associated MOS transistor and to obtain an efficient operation thereof.

In detail, the charge pump circuit according to the invention is composed of a pair of switches 20 and 21 placed between the DC supply $V_{CC}$ and the ground 22, and controlled as to opening and closing by an oscillating signal (for example, with a frequency of 500 kHz) supplied on the terminal 23. The control signal applied to the switches 20 and 21 is suitably phase-shifted or 180° so that, when one switch is open, the other is closed and vice versa. Such a phase opposition is obtained, for example, by means of a logical inverter 28 or the switches may be implemented by devices switched-on by opposite phases of the oscillating signal. The circuit furthermore comprises a capacitor 24 connected with a terminal to a point intermediate to the two switches 20 and 21, and with its other terminal to a DC supply voltage (e.g. at 12 V) through a diode 25. A further diode 26 is connected with its anode to the connection point between the cathode of the diode 25 and the capacitor 24 and with its cathode to the capacitor 27 (representing the capacitance of the MOS transistor) and to the cathode of a diode 10, the anode whereof is connected to the supply voltage $V_{CC}$.

The charge pump circuit according to FIG. 1 operates as follows. In a steady state of the circuit the voltage drop on the capacitor 27 is maintained approximately at 12 v (i.e. the voltage on line 29), by virtue of the capacitor 24 which, through the pair of switches 20 and 21 and the diode 25, continually charged to a 12 V voltage at a frequency of 500 kHz.

Figure 2:
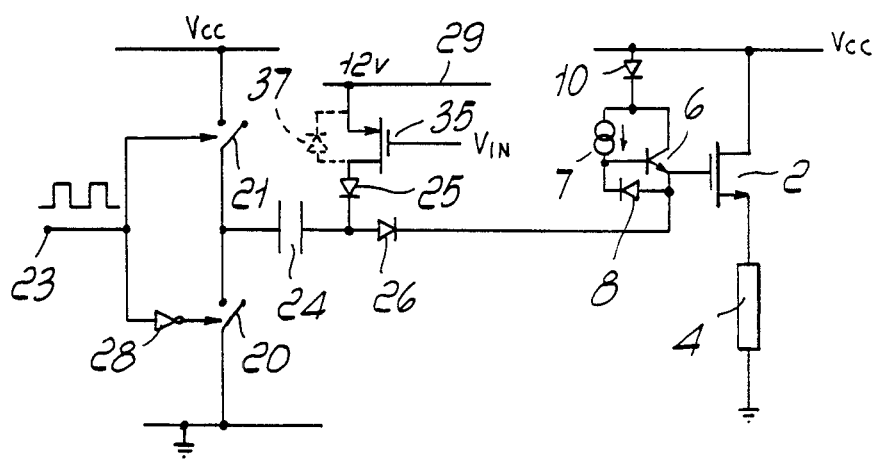
FIG. 2 shows the equivalent electric diagram of a load driving device, comprising the charge pump according to the invention.

FIG. 2 shows an example of the application of the charge pump, according to the invention, to a MOS transistor for driving a load. In this drawing figure, the components of the charge pump have been indicated at the same reference numerals of FIG. 1, except the capacitor 27 which has been here neglected, since it is inherent to the gate of the MOS transistor 2. Thus the circuit comprises the drive transistor 2, having its drain connected to the supply voltage $V_{CC}$, its gate connected to the cathode of diode 26 and its source connected to a circuit which has the function of assuring the connection to the positive supply, such circuit comprising a diode 10 having its anode connected to the supply voltage and its cathode connected to the gate of MOS transistor 2 through a transistor 6, a current source 7 and a diode 8. The circuit further comprises a MOS transistor 35 arranged between the anode of diode 25 and the reference voltage line 29, at 12 V. In the figure the parasitic diode 37 is also shown, which is formed between the source and the drain of the MOS transistor 35. The gate of the transistor 35 is furthermore fed with a control signal $V_{IN}$ for controlling turning on or off of the charge pump circuit.

The circuit according to FIG. 2 operates as follows. By virtue of the diode 10 being connected to the supply voltage, the gate of the MOS transistor 2 is quickly charged at the supply voltage, then (when the gate of the transistor 35 is fed with the control signal $V_{IN}$ of such a level as to cause turning-on of the same transistor 35 thus allowing connection of diode 25 to the reference voltage line 29) the charge pump is switched on and in turn provides for raising of the gate voltage of the transistor 2 thereby shortening the turn-on time and allowing proper operation of the transistor 2 itself.

Therefore, as explained, the charge pump circuit according to the invention allows for an efficient operation and a quick turning-on of the MOS transistor for driving loads, in particular inductive loads, through simple elements, which are easily integrated and highly reliable.

The invention thus conceived is susceptible of several modifications and variations, without departing from the inventive scope. In particular all the elements may be replaced by other technically equivalent ones.

We claim:

1. A charge pump circuit for driving N-channel MOS transistors, for connection to a N-channel MOS transistor having a drain electrode connected to a supply voltage line, a source electrode connected to a load and a gate electrode, comprising a capacitor connected with a first terminal thereof to a reference voltage line through a first switch element and with a second terminal thereof to a switching section arranged between said supply voltage line and a ground line and being controlled so as to alternately and selectively connecting said second terminal of said capacitor to said supply voltage line and to said ground line, said first terminal of said capacitor being further connected to said gate electrode of said N-channel MOS transistor.

2. A circuit according to claim 1 wherein said first switch element comprises a further MOS transistor having a source electrode connected to said reference voltage line, a drain electrode connected to said first terminal of said capacitor and a gate electrode receiving an input signal controlling switching-on and -off of said charge pump circuit.

3. A circuit according to claim 1 wherein said first terminal of said capacitor is connected to said gate electrode of said MOS transistor through a second switch element.

4. A circuit according to claim 3 wherein said second switch element is a diode having its anode electrode connected to said capacitor and its cathode electrode connected to said gate electrode.

5. A circuit according to claim 2 wherein said first switch element further comprises a diode having its anode connected to said drain electrode of said further MOS transistor and its cathode connected to said first terminal of said capacitor.

* * * * *